United States Patent [19]
Otsuka

[11] Patent Number: 5,345,958
[45] Date of Patent: Sep. 13, 1994

[54] DOUBLE FLUID LAYER-TYPE ULTRASONIC CLEANING APPARATUS

[76] Inventor: Shigeo Otsuka, 4-7, Nakashinkai, 2-chome, Higashi-Osaka, Japan

[21] Appl. No.: 131,148

[22] Filed: Oct. 4, 1993

[51] Int. Cl.⁵ .............................................. B08B 3/10
[52] U.S. Cl. .................................... 134/105; 134/184; 134/108
[58] Field of Search .................... 134/1, 25.4, 184, 32, 134/105, 61, 108; 68/18 R, 355; 8/159

[56] References Cited

U.S. PATENT DOCUMENTS

| | | | |
|---|---|---|---|
| 3,011,924 | 12/1961 | Rand | 134/32 |
| 3,021,235 | 2/1962 | Schumacher | 134/32 X |
| 3,094,469 | 6/1963 | Strauss et al. | 134/1 |
| 3,923,545 | 12/1975 | Healy | 134/105 |
| 4,367,098 | 1/1983 | McCord | 134/1 |

Primary Examiner—Frankie L. Stinson
Attorney, Agent, or Firm—Moonray Kojima

[57] ABSTRACT

The present invention relates to a double fluid layer-type ultrasonic cleaning apparatus for cleaning such a workpiece as electronic element and pressed component by immersing it in a cleaning bath, wherein cleaning and removal of foreign substances adhered in spacings and blind holes of the workpiece are assured by storing a cleaning solution of upper layer having a lower specific gravity and containing a hydrocarbon solvent as a main component in an upper stock fluid area of the cleaning bath, and another of lower layer having a higher specific gravity and containing an inert solvent as a main component thereof in a lower stock fluid area of the cleaning bath so as to provide two fluid layers.

1 Claim, 1 Drawing Sheet

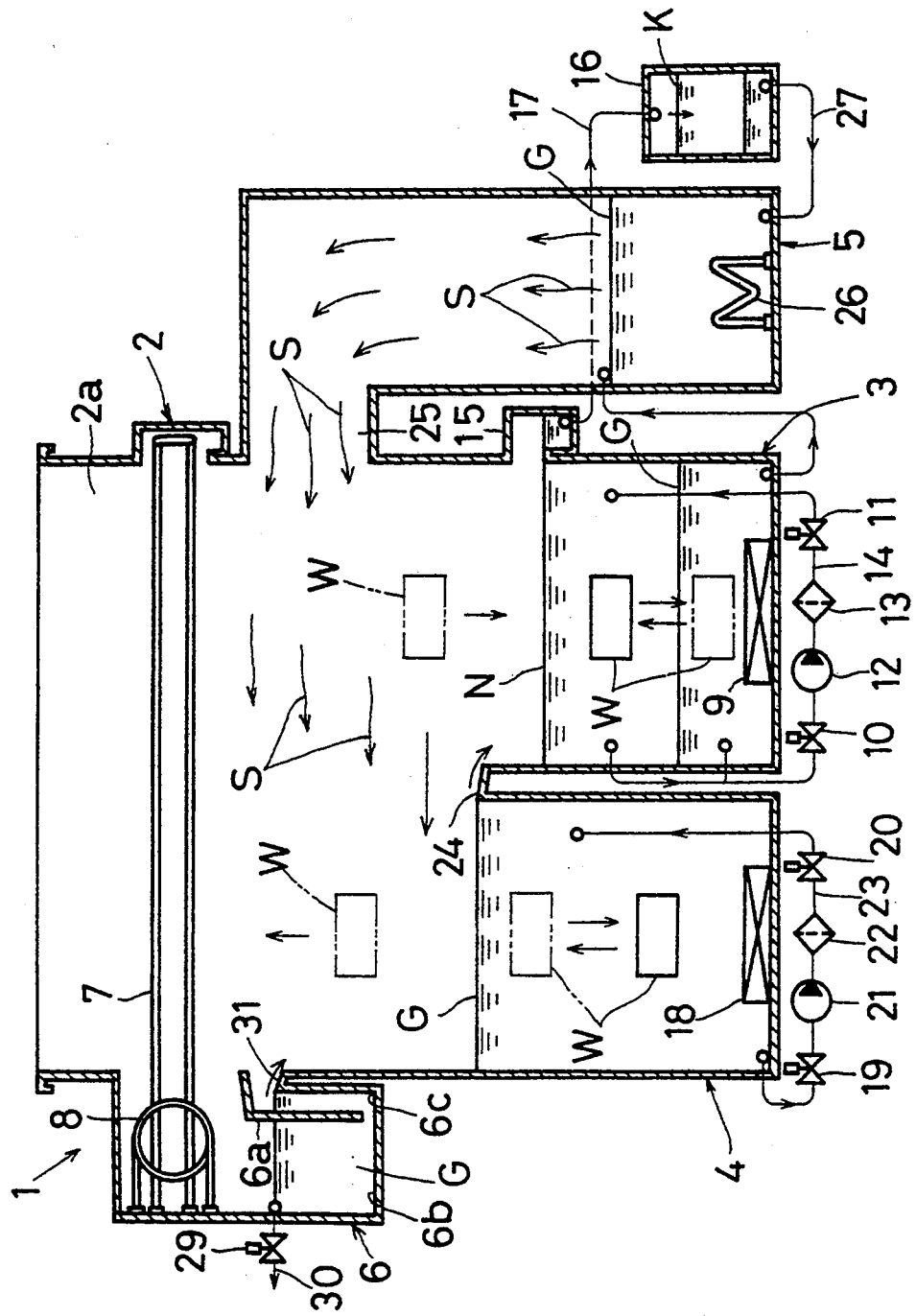

DOUBLE FLUID LAYER-TYPE ULTRASONIC CLEANING APPARATUS

SUMMARY OF THE INVENTION

The present invention relates to a double fluid layer-type ultrasonic cleaning apparatus for cleaning such workpieces as electronic components and press parts by immersing it in a cleaning bath, wherein cleaning and removal of foreign substances adhered in spacings and blind holes of the workpiece are assured by storing a cleaning solution of upper layer having a lower specific gravity and containing a hydrocarbon solvent as a main component in an upper stock fluid area of the cleaning bath, and another of lower layer having a higher specific gravity and containing an inert solvent as a main component thereof in a lower stock fluid area of the cleaning bath so as to provide two fluid layers.

BACKGROUND OF THE INVENTION

It is conventionally known as a method of cleaning such workpiece as electronic elements, for example, that a workpiece is immersed in a cleaning solution containing an inert solvent as a main component and stored in an ultrasonic cleaning bath for cleaning and removing such foreign substances as greases and chips adhered to surfaces of the workpiece by cavitation of the cleaning solution by means of an ultrasonic oscillator.

However, in such ultrasonic cleaning of a workpiece by using a cleaning solution containing an inert solvent as a main component as described above, however, it is a problem that a high cleaning performance cannot be obtained, because the solution is lower in cleaning performance of separating and removing greases adhered to the workpiece in comparison with a cleaning solution containing hydrocarbon solvent as a main component.

Although the above problem can be solved by ultrasonically cleaning a workpiece with a cleaning solution containing a hydrocarbon solvent as a main component, after the cleaning operation, when no more element for deaeration is present, such as when the ultrasonic is discontinued, because the air is dissolved in the cleaning solution, and propagation of the ultrasonic oscillation is inferior, a cleaning effect by the hydrocarbon solvent cannot be expected. In addition, as hydrocarbon solvents is higher in surface tension and lower in permeability than inert solvents, it is difficult to clean and remove foreign substances adhered in spacings and blind holes of a workpiece, and an isolating means for preventing it from being in contact with the air that may cause inflammation must be further provided, thus, requiring a careful handling.

Moreover, in the case of using both hydrocarbon and inert solvents, because a cleaning bath for storing the hydrocarbon solvent and another for the inert solvent are independently employed, it is another problem that an entire apparatus comes to be complicated in structure and bulky.

OBJECTS OF THE INVENTION

Hence, it is an object of the invention to provide a double fluid layer-type ultrasonic cleaning apparatus capable of securely cleaning and removing foreign substances adhered in spacings and blind holes of a workpiece and efficiently providing for a cleaning process that requires a high technology by ultrasonically cleaning the workpiece with cleaning solutions of upper and lower layers, that is, a cleaning solution of upper layer containing a hydrocarbon solvent as a main component and stored in an upper stock fluid area of a cleaning bath and another in a lower layer containing an inert solvent as a main component and stored in a lower stock fluid area of the bath.

It is another object of the invention to provide a double fluid layer-type ultrasonic cleaning apparatus capable of increasing deaeration of a hydrocarbon solvent by means of air solution effect of an inert solvent, because a workpiece is ultrasonically cleaned by the cleaning solutions of upper and lower layers stored in a single cleaning bath, maintaining a propagation efficiency of ultrasonic oscillation, and providing, thereby, for a sufficient cleaning effect by the hydrocarbon solvent. Additionally, as the hydrocarbon and inert solvents are stored in the single cleaning bath, an entire apparatus is simple in structure, and is reduced in size.

It is a further object of the invention to provide a double fluid layer-type ultrasonic cleaning apparatus, wherein an inert solvent in spacings and blind holes of a workpiece is replaced by a hydrocarbon solvent, when the workpiece is carried out of the inert solvent into the hydrocarbon solvent, because the hydrocarbon solvent is lower in surface tension and higher in permeability than the inert solvent. In other words, because the spacings and blind holes of the workpiece is once permeated by the inert solvent, and the inert solvent is then replaced by the hydrocarbon solvent, the permeability of hydrocarbon solvent is increased, and the entire workpiece is securely cleaned.

It is still further object of the invention to provide a double fluid layer-type ultrasonic cleaning apparatus, wherein a hydrocarbon solvent is securely prevented from inflammation, and easily handled, because a workpiece is subjected to a steam cleaning by evaporating a cleaning solution stored in a cleaning bath, in the case of a typical cleaning apparatus, and the hydrocarbon solution stored in the cleaning bath is covered in its entire surface by the steam of inert solution, and isolated so as to have no contact with the air that may cause such inflammation, as the steam of inert solvent is emitted to an upper space of the cleaning bath.

BRIEF DESCRIPTION OF THE DRAWING

FIGURE 1 is an overall structural drawing showing a cleaning method of workpiece by a double fluid layer-type ultrasonic cleaning apparatus of the invention.

EMBODIMENT

An embodiment of the invention is described in detail by referring to the FIGURE.

In FIGURE 1, a double fluid layer-type ultrasonic cleaning apparatus for ultrasonically cleaning a workpiece with upper and lower cleaning solutions stored in a single cleaning bath is shown, wherein a double fluid layer-type ultrasonic cleaning apparatus 1 is provided with a first cleaning bath 3 for ultrasonically cleaning a workpiece W by using a cleaning solution N of upper layer containing a hydrocarbon solvent (trade name of NAPHTESOL, prepared by Japan Petrochemical Co., Ltd.) as a main component and a cleaning solution G of lower layer containing an inert solvent (trade name of GALDEN, perfluoropolyether=PFC, prepared by AUSIMONT, or trade name of Florinart, PF series, Sumitomo-3M Co., Ltd.) placed in alignment with a second cleaning bath 4 for immersion or ultrasonic cleaning of the workpiece W by using the cleaning solution G that is distilled and condensed in a cleaning room 2 that is airtightly enclosed, a solvent distilling bath 5 placed in communication in a side-wall corresponding to the first cleaning bath 3 for distilling and condensing the cleaning solution G and a water separation bath 6 in communication in a side-wall corresponding to the second cleaning bath 4 for separating water from the cleaning solution G that is condensed and liquidated.

In the cleaning room 2, an workpiece inlet/outlet 2a is opened in an upper part of the room for introduction and removal of the workpiece W, a cooling jacket 7 provided in an upper steam area of the first cleaning bath 3 and second cleaning bath 4 located in a lower part of the room, a cooling coil 8 in an upper steam area of the water separation bath 6 placed in communication in a side of the room, and the cooling jacket 7 and cooling coil 8 are maintained at a temperature at which a steam S of the cleaning solution G emitted to the upper steam area inside the room is condensed and liquidated by circulating a supply of coolant cooled to an appropriate temperature by a refrigerator (not shown) in the cooling jacket 7 and cooling coil 8, for example. In other words, a part of the cleaning solution G condensed and liquidated by the cooling jacket 7 drips, and is supplied to the first and second cooling baths 3 and 4, and a part of the cleaning solution G condensed and liquidated by the cooling coil 8 drips, and is supplied to the water separation bath 6.

In the first cleaning bath 3, for example, the cleaning solution comprising a single or composite solvent containing the hydrocarbon solvent as a main component and the cleaning solution G comprising a single or composite solvent containing the inert solvent as a main component are separated vertically due to their specific gravities, so that the cleaning solution N with a lower specific gravity is stored in a predetermined volume in an upper stock fluid area of the bath, and the cleaning solution with a higher specific gravity stored in a predetermined volume in a lower stock solution area. In the embodiment, although the workpiece W is cleaned by the cleaning solution G containing perfluoropolyether=PFC solvent as a main component, such inert solvent as hydrofluorocarbon=HFC solvent in place of the PFC solvent, for example.

In addition, an ultrasonic oscillator 9 for ultrasonically oscillating the cleaning solutions N, G is employed in a bottom wall within the bath, an ultrasonic oscillation is induced in the cleaning solution of lower layer and cleaning solution of upper layer are by oscillating the ultrasonic oscillator 9 at an oscillation frequency of 27 kHz to 200 kHz, for example, a side-wall corresponding to the upper and lower stock fluid areas of the bath is connected in communication with the other side-wall corresponding to the upper stock fluid area of the bath by a fluid circuit 14 through circulating valves 10, 11, circulating pump 12 and a filter 13, and the cleaning solution N of upper layer and cleaning solution G of lower layer stored in the first cleaning bath 3 are cleanly filtered by the filter 13, and supplied for circulation by a transferring force of the circulating pump 12.

Moreover, an exhaust fluid reservoir 15 is provided in communication in a side-wall corresponding to a surface part of the cleaning solution N that is stored in the first cleaning bath 3, and a bottom wall of the exhaust fluid reservoir 15 is connected in communication with an upper wall of a fluid collection tank 16 positioned in one side of a lower part by means of a fluid collecting channel 17, thus, greases floating in the surface of cleaning solution N is allowed to overflow to the exhaust fluid reservoir 15, and removed to the fluid collecting tank 16.

In the second cleaning bath 4, the cleaning solution G is stored in a predetermined volume so that a liquid level thereof is higher than that of the cleaning solution N stored in the first cleaning bath, an ultrasonic oscillator 18 is provided in a bottom wall within the bath for ultrasonically oscillating the cleaning solution G, an ultrasonic oscillation is induced in the cleaning solution G by oscillating the ultrasonic oscillator 18 at an oscillation frequency of 27 kHz to 200 kHz, for example, a bottom wall corresponding to a lower stock fluid area of the bath is connected in communication with a side wall corresponding to an upper stock fluid area of the bath by a fluid conduit 23 through circulating valve 19, 20, a circulating pump 21 and a filter 22, and the cleaning solution G stored in the first cleaning bath 3 is cleanly filtered by the filter 22, and supplied for circulation by a transferring force of the circulating pump 21.

Furthermore, a downflow plate 24 for overflow of the cleaning solution G from the second cleaning bath 4 in the upper side toward the first cleaning bath 3 in the lower side is employed at an angle between adjacent side-walls of the second cleaning bath 4 located in the upper side and first cleaning bath 3 in the lower side, so that the cleaning solution G stored in the second cleaning bath 4 is allowed to overflow, and supplied to the first cleaning bath 3.

In the solvent distilling bath 5, a side-wall corresponding to the upper steam area of the first cleaning bath 3 is connected in communication with a side-wall corresponding to an upper steam area of the solvent distilling bath 5 by a steam supply channel 25, a fluid heating pipe 26 is employed in a bottom wall within the bath for evaporating and gasifying the cleaning solution G, and such heating medium as oil or diluted solution heated to an appropriate temperature is supplied for circulation to the fluid heating pipe 26 by a heating device (not shown), so that the fluid heating pipe 26 is heated to a temperature at which the cleaning solution G contained in the bath is evaporated and gasified. In other words, a steam S of the cleaning solution G evaporated and gasified by the fluid heating pipe 26 is emitted from the steam supply channel 25 toward the upper steam areas of the first and second cleaning baths 3 and 4.

Additionally, a bottom wall corresponding to a lower stock fluid area of the solvent distilling bath 5 is connected in communication with a bottom wall of the fluid collecting tank 16 by a fluid collecting channel 27, an exhaust fluid K containing greases, chips and the like is vertically separated from the cleaning solution G by means of the specific gravity, when the cleaning solution G is mixed in the exhaust solution K collected in the fluid collecting tank 16, and the cleaning solution G lowered by its own weight to a bottom part of the bath is collected through the fluid collecting channel 27 to the solvent distilling bath 5, distilled, and condensed again. Further, a bottom wall corresponding to a lower stock fluid area of the first cleaning bath 3 is connected in communication with an upper wall higher than a surface level of the cleaning solution G stored in the solvent distilling bath 5 by a fluid collecting channel 28, and the cleaning solution stored in the first cleaning bath 3 is collected through the fluid collecting channel 28 to the solvent distilling bath 5, distilled, and condensed again.

In the water separation bath 6, separation baths 6b, 6c are formed in division by uprightly providing a partition plate 6a in a position for laterally dividing a lower stock fluid area in the bath, a fluid outlet 30 is connected through an outlet valve 29 in communication in a side-wall corresponding to a surface part of the separation bath 6b, a downflow plate 31 is placed at an angle between adjacent side-walls of the separation bath 6c of the water separation bath 6 positioned in the upper side and the second cleaning bath 4 placed in the lower side for allowing overflow of the cleaning solution G that is water-separated from the separation bath 6c in the upper side toward the second cleaning bath 4 in the lower side, the cleaning solution G condensed and liquified by the cooling jacket 7 and cooling coil 8 drips, and is supplied to the side of separation bath of the water separation bath 6, and only water lower in specific gravity, thereby, floating in the fluid surface of the separation bath 6b is removed from the bath through the fluid outlet 30, while the cleaning solution G higher in specific gravity, thereby, built up in a bottom part of the bath is allowed to overflow from the separation bath 6c to the second cleaning bath 4.

The embodiment shown in the FIGURE should be structured as above, and a cleaning method of the workpiece W according to a double fluid layer-type ultrasonic cleaning apparatus is now described below.

As shown in FIGURE 1, the cleaning solution G contained in the solvent distilling bath 5 is heated to such temperature that it is evaporated, and gasified by the fluid heating tube 26, and the steam S of cleaning solution G is emitted to an upper steam area of the first and second cleaning baths 3 and 4. Simultaneously, the steam S of cleaning solution G is condensed by means of a cooling effect of the cooling jacket 7 and cooling coil 8, so that the steam S emitted to the upper steam area of the first and second cleaning baths 3 and 4 is condensed. In other words, because the air is lower in specific gravity than the steam S of cleaning solution G emitted into the cleaning room 2, the air that may cause inflammation of the cleaning solution N is prevented from entering into the cleaning room 2, when the workpiece W is introduced. In addition, since a surface of the cleaning solution N contained in the first cleaning bath 3 is covered by the steam S with a high concentration, the cleaning solution N is completely isolated so as not to be in contact with the air, and inflammation of the cleaning solution N can be securely avoided.

Succeedingly, after partly or completely opening the workpiece inlet/outlet 2a of cleaning room 2, the workpiece W to be cleaned is passed through the steam S of cleaning solution G emitted to the room, and immersed entirely into the cleaning solution N of upper layer that is stored in the first cleaning bath 3. By oscillating the ultrasonic oscillator 9 with the workpiece inlet/outlet 2a of the cleaning room 2 completely closed or opened, such foreign substances as greases and chips adhered to the surface of workpiece W is cleaned, and removed by cavitation of the cleaning solution N stored in the first cleaning bath.

For example, in the case of cleaning a workpiece W with narrow spacings or many blind holes, by moving the workpiece W from the cleaning solution N of upper layer into the cleaning solution G of lower layer that are contained in the first cleaning bath 3, and immersing the entire workpiece once in the cleaning solution G of lower layer stored in the bath, the cleaning solution G can immediately permeate into spacings, blind holes and the like of the workpiece W, because the cleaning solution G of lower layer is lower in surface tension and higher in permeability than the cleaning solution N of upper layer. Then, by moving the workpiece from the cleaning solution G of lower layer into the cleaning solution N of upper layer that are contained in the first cleaning bath 3, the workpiece is permeated by the cleaning solution N that replaces the cleaning solution G flowing out of the spacings, blind holes and the like.

Simultaneously, by driving the circulating pump 12, cleanly filtering the cleaning solutions N and G stored in the first cleaning bath 3 by means of the filter 13, and supplying them for circulation, because deaeration of the cleaning solution N is increased by air dissolving effect of the cleaning solution G, and a transferring efficiency of ultrasonic oscillation induced by the ultrasonic oscillator 9 is enhanced, a sufficient cleaning effect by the cleaning solution N can be provided.

Then, the workpiece W is once removed from the cleaning solution N contained in the first cleaning bath 3, and entirely immersed into the cleaning solution G stored in the second cleaning bath 4 for cleaning and removing the cleaning solution N remaining in adhesion to spacings and blind holes of the workpiece W. Alternatively, by oscillating the ultrasonic oscillator 18, the cleaning solution N remaining in adhesion to the workpiece W is cleanly removed. At the same time, the cleaning solution N separated from the workpiece W is allowed to float in the surface of cleaning solution G, and the cleaning solution N floating in the surface is returned to the first cleaning bath 3 by overflow.

In succession, after a secondary cleaning, the workpiece W is once removed from the cleaning solution G contained in the second cleaning bath 4, heated in its entirety to an appropriate temperature by the steam S of cleaning solution G emitted to the cleaning room 2, and dried. After the workpiece inlet/outlet 2a of cleaning room 2 is partly or completely opened, the workpiece W cleaned is taken out of the room, and the cleaning operation of workpiece W is completed.

Thus, because the workpiece W is immersed in the cleaning solutions N, G stored in the first cleaning bath 3 for ultrasonic cleaning, deaeration of the cleaning solution N containing a hydrocarbon solvent as a main component is enhanced by air dissolving effect of the cleaning solution G containing an inert solvent as a main component, the transferring efficiency of ultrasonic oscillation is maintained, thereby a sufficient cleaning effect of the cleaning solution N can be provided. Additionally, since the cleaning solutions N, G are stored in the first cleaning bath 3, the entire apparatus is provided in a simple structure and reduced size.

Besides, because the cleaning solution G containing an inert solvent as a main component is lower in surface tension and higher in permeability than the cleaning solution N containing a hydrocarbon solvent as a main component, when the workpiece W is removed from the cleaning solution G into the cleaning solution N, the workpiece is permeated in spacings and blind holes by the cleaning solution N that replaces the cleaning solution G, and the entire workpiece W can be securely cleaned.

Moreover, since the entire surface of cleaning solution N stored in the first cleaning bath 3 is covered by the steam S of cleaning solution G, it is completely isolated from being in contact with the air that may cause inflammation, the cleaning solution N is securely prevented from inflammation, and its handling is simplified.

In a structure of the invention, and in reference to the embodiment, although a cleaning bath corresponds to the first cleaning bath 3, similarly, a cleaning solution of upper layer to the cleaning solution N, and a cleaning solution of lower layer to the cleaning solution G, it will be appreciated that the invention is not limited to the structure of above embodiment.

In the embodiment, although the cleaning solution G stored in the first cleaning bath 3 is collected to the solvent distilling bath 5, distilled, and condensed again, the cleaning solution G may be distilled, and condensed by a distillation column, for example, and a distillation method is not limited to that of the embodiment.

I claim:

1. An ultrasonic cleaning apparatus comprising:

a first container (3) for holding a first cleaning solution (N) containing a hydrocarbon solvent, and below said first cleaning solution a second cleaning solution (G) containing an inert solvent, said first container having an open end;

a first ultrasonic means (9) disposed in said first container and within said second cleaning solution;

a second container (4) for holding said second cleaning solution (G) and having an open end;

a second ultrasonic means (18) disposed in said second container and within said second cleaning solution;

a third container (5) for holding said second cleaning solution (G), and having an open end;

communicating means disposed above said first, second and third containers for communicating the open ends thereof;

heating means (26) disposed in said third container for causing evaporation of said second cleaning solution so as to disperse product of said evaporation above the open ends of said first and second containers;

condensing means (7,8) disposed in said communicating means for condensing said product of said evaporation; and means (6) disposed below said condensing means for collecting condensation resulting from condensing of said product of said evaporation;

whereby an object to be cleaned is moved within said first container through said first cleaning solution and into said second cleaning solution and said first ultrasonic means is operated, then said object is removed from said second cleaning solution through said first cleaning solution, and then moved into said second cleaning solution within said second container and said second ultrasonic means is operated, and then said object is moved out of said second cleaning solution and through said product of said evaporation.

* * * * *